(12) United States Patent
Lloyd et al.

(10) Patent No.: US 11,165,185 B2
(45) Date of Patent: Nov. 2, 2021

(54) ELECTRICAL CONNECTOR HEAT SINK WITH PROTECTIVE RAMP

(71) Applicant: Molex, LLC, Lisle, IL (US)

(72) Inventors: Brian Keith Lloyd, Maumelle, AR (US); Bruce Reed, Maumelle, AR (US); Saiyed Muhammad Hasan Ali, Maumelle, AR (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/649,136

(22) PCT Filed: Sep. 19, 2018

(86) PCT No.: PCT/US2018/051771
§ 371 (c)(1),
(2) Date: Mar. 20, 2020

(87) PCT Pub. No.: WO2019/060429
PCT Pub. Date: Mar. 28, 2019

(65) Prior Publication Data
US 2020/0295498 A1  Sep. 17, 2020

Related U.S. Application Data

(60) Provisional application No. 62/561,273, filed on Sep. 21, 2017.

(51) Int. Cl.
*H01R 13/502* (2006.01)
*H01R 13/658* (2011.01)
(Continued)

(52) U.S. Cl.
CPC ......... *H01R 13/502* (2013.01); *H01R 13/658* (2013.01); *G02B 6/4261* (2013.01);
(Continued)

(58) Field of Classification Search
CPC ......... H01L 23/34–4735; G02B 6/4266–4273; G02B 6/4261; H01R 13/502; H01R 13/658
(Continued)

(56) References Cited

U.S. PATENT DOCUMENTS 7,974,098 B2   7/2011  Oki et al.
2005/0195565 A1  9/2005  Bright
(Continued)

FOREIGN PATENT DOCUMENTS

CN    200994252 Y    12/2007
CN    102967905 A    3/2013
(Continued)

OTHER PUBLICATIONS

International Preliminary Report on Patentability received for PCT Application No. PCT/US2018/051771, dated Apr. 2, 2020, 6 Pages.
(Continued)

*Primary Examiner* — Abdullah A Riyami
*Assistant Examiner* — Justin M Kratt

(57) ABSTRACT

A connector system includes a cage assembly in which a thermally conductive heat sink and a connector are mounted. The heat sink includes a base, a ramp extending downwardly from the base and a pedestal extending downwardly from the base. A thermal interface material is disposed on lower surface of the pedestal. A module can be inserted into the cage assembly and connected to the connector and to the heat sink. Thermal energy generated by the module is transferred to the heat sink which dissipates the heat by convention. The ramp protects a leading edge of the thermal interface material form engagement by the module during insertion of the module into the cage assembly.

20 Claims, 16 Drawing Sheets

(51) Int. Cl.
  *H01L 23/34* (2006.01)
  *G02B 6/42* (2006.01)
  *H05K 7/20* (2006.01)
  *H01L 23/473* (2006.01)

(52) U.S. Cl.
  CPC .......... *G02B 6/4266* (2013.01); *G02B 6/4269* (2013.01); *G02B 6/4273* (2013.01); *H01L 23/34* (2013.01); *H01L 23/4735* (2013.01); *H05K 7/20* (2013.01)

(58) Field of Classification Search
  USPC .................................. 439/485, 487; 174/86.3
  See application file for complete search history.

(56) References Cited

U.S. PATENT DOCUMENTS

| | | |
|---|---|---|
| 2010/0008025 A1 | 1/2010 | Nemoz et al. |
| 2010/0067196 A1 | 3/2010 | Costello et al. |
| 2012/0127665 A1 | 5/2012 | Prete et al. |
| 2013/0157499 A1* | 6/2013 | Crippen ............... H01R 12/724 439/487 |
| 2013/0164970 A1 | 6/2013 | Regnier et al. |
| 2013/0210269 A1 | 8/2013 | Neer et al. |
| 2014/0098497 A1 | 4/2014 | Henry et al. |
| 2017/0054234 A1* | 2/2017 | Kachlic .............. H01R 13/6594 |

FOREIGN PATENT DOCUMENTS

| | | |
|---|---|---|
| CN | 105874368 B | 7/2017 |
| JP | 2010085805 A | 4/2010 |
| WO | 2014/075429 A1 | 5/2014 |

OTHER PUBLICATIONS

International Search Report and Written Opinion received for PCT Application No. PCT/US2018/051771, dated Mar. 29, 2019, 7 Pages.

Office Action received for JP application No. 2020-514256, dated May 11, 2021, 14 pages (7 pages of English translation and 7 pages of official copy).

* cited by examiner

ELECTRICAL CONNECTOR HEAT SINK WITH PROTECTIVE RAMP

RELATED APPLICATIONS

This application claims priority to International Application No. PCT/US2018/051771, filed on Sep. 19, 2018, which further claims the benefit of U.S. Provisional Application Ser. No. 62/561,273, filed on Sep. 21, 2017, the contents of both applications are incorporated herein in their entirety.

FIELD OF THE INVENTION

This disclosure relates to field of electrical connectors, more specifically to the field of input/output (I/O) connectors configured to manage thermal energy.

DESCRIPTION OF RELATED ART

Input/Output (I/O) connectors are commonly used to provide connectivity between boxes or racks of computers, routers and switches. Commonly used formats of I/O connectors include Small form-factor pluggable (SP)), Quad small form-factor pluggable (QSFP), miniSAS, miniSAS HD and PCIe 8× connectors. These connectors include plugs and receptacles that are defined by standard bodies and intended to provide reliable performance regardless of the vendor.

Typical I/O connector systems include a cable assembly and a board mounted connector. The cable assembly, which commonly includes a pair of plug connectors on opposite ends of a cable, is configured to transmit signals over a desired distance. The board mounted connector, which is typically a receptacle positioned in a panel with the receptacle configured to receive and mate with the plug connector.

As data rates have increased, one issue that has been difficult to overcome is the physical limitation of medium that is used to transmit signals from between the plug connectors. Passive cables, for example, are cost effective for shorter distances but tend to be limited with respect to distance as signal frequencies increase. Active copper and fiber optic cables are well suited to transmit signals over longer distances but require power and thus tend to create thermal issues if the connector system is not properly designed. One of the major issues with the increased use of active cables assemblies, however, is the increased thermal burden the use of such assemblies place on the system. Attempting to cool a module that is placed inside a guide frame or cage is relatively challenging. Thus, certain individuals would appreciate an improvement to thermal management in the receptacle system used in I/O connectors.

Various configurations have been used to manage thermal energy in I/O connectors, especially in rack type mounting systems. Typically, the rack includes a cage configured with an upper port and a lower port. In these arrangements the upper port is somewhat exposed to the exterior of the rack whereas the lower port is positioned with no external visibility. In these arrangements, a heat sink can be readily adapted to engage a module positioned in the upper port but not to one positioned in the lower port. In these instances, other thermal management structures have been employed, such as directed air flow and other thermal transfer methods such as thermally conductive spring fingers adapted to engage the module and channel the thermal energy to an exterior positioned heat sink. These methods can be costly and use valuable space limiting options for adjacently positioned I/O connectors especially in high density architecture.

BRIEF SUMMARY

A connector system includes a cage assembly in which a thermally conductive heat sink and a connector are mounted. The heat sink includes a base, a ramp extending downwardly from the base and a pedestal extending downwardly from the base. A thermal interface material is disposed on lower surface of the pedestal. A module can be inserted into the cage assembly and connected to the connector and to the heat sink. Thermal energy generated by the module is transferred to the heat sink which dissipates the heat by convection. The ramp protects a leading edge of the thermal interface material from engagement by the module during insertion of the module into the cage assembly.

BRIEF DESCRIPTION OF THE DRAWINGS

The present invention is illustrated by way of example and not limited in the accompanying figures in which like reference numerals indicate similar elements and in which.

DETAILED DESCRIPTION

Figure 1:
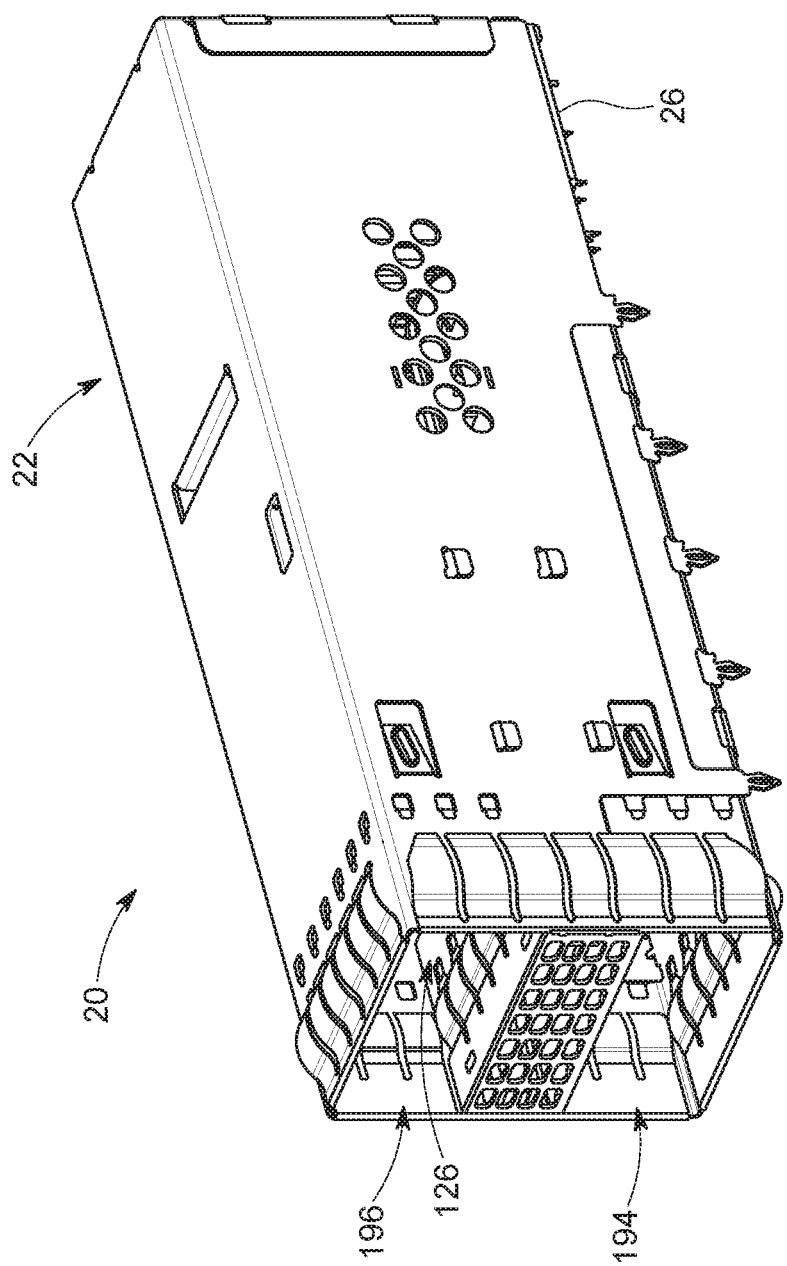
FIG. 1 is a perspective view of a connector system.
Figure 2:
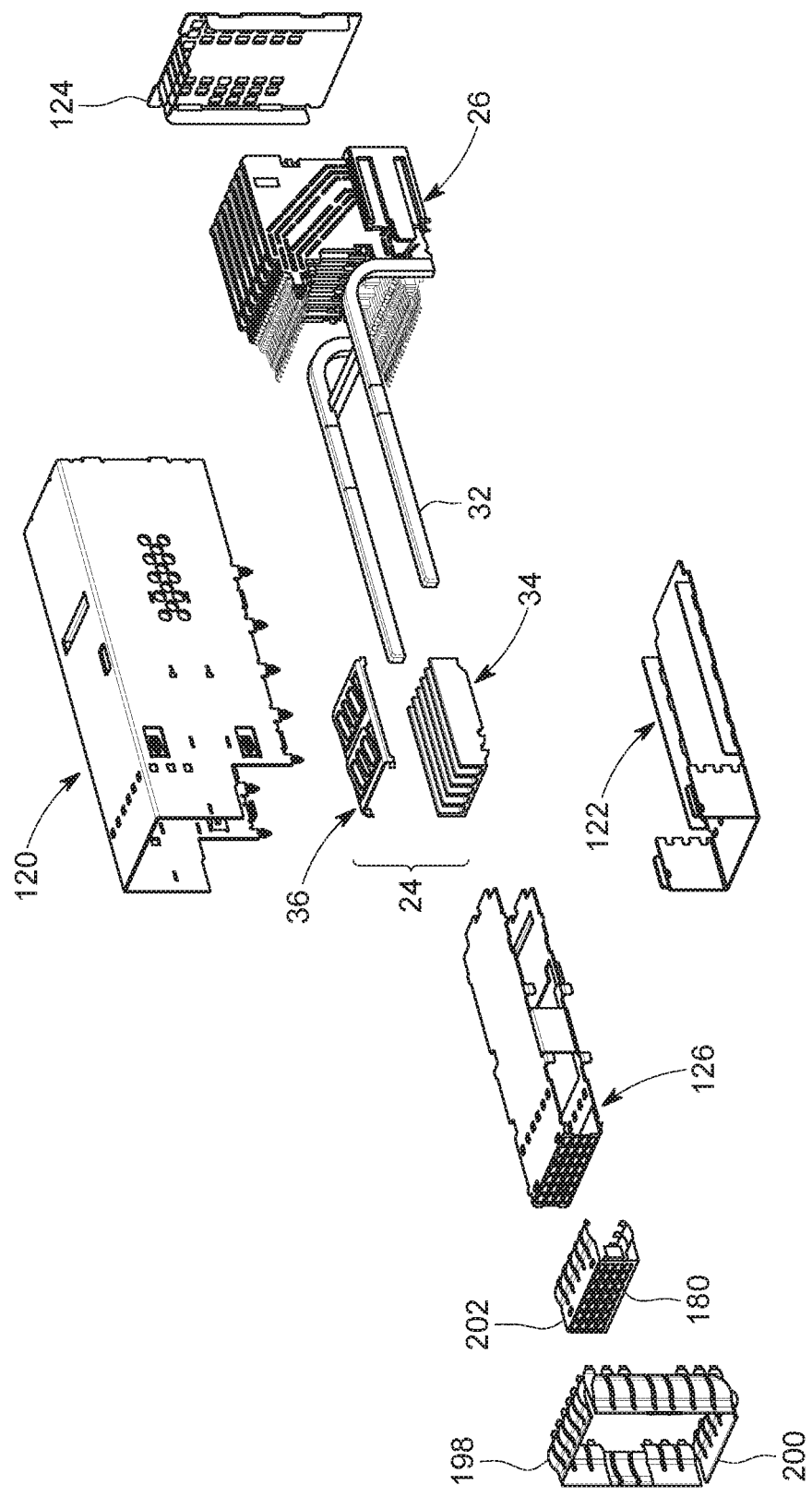
FIG. 2 is an exploded perspective view of the connector system.
Figure 3:
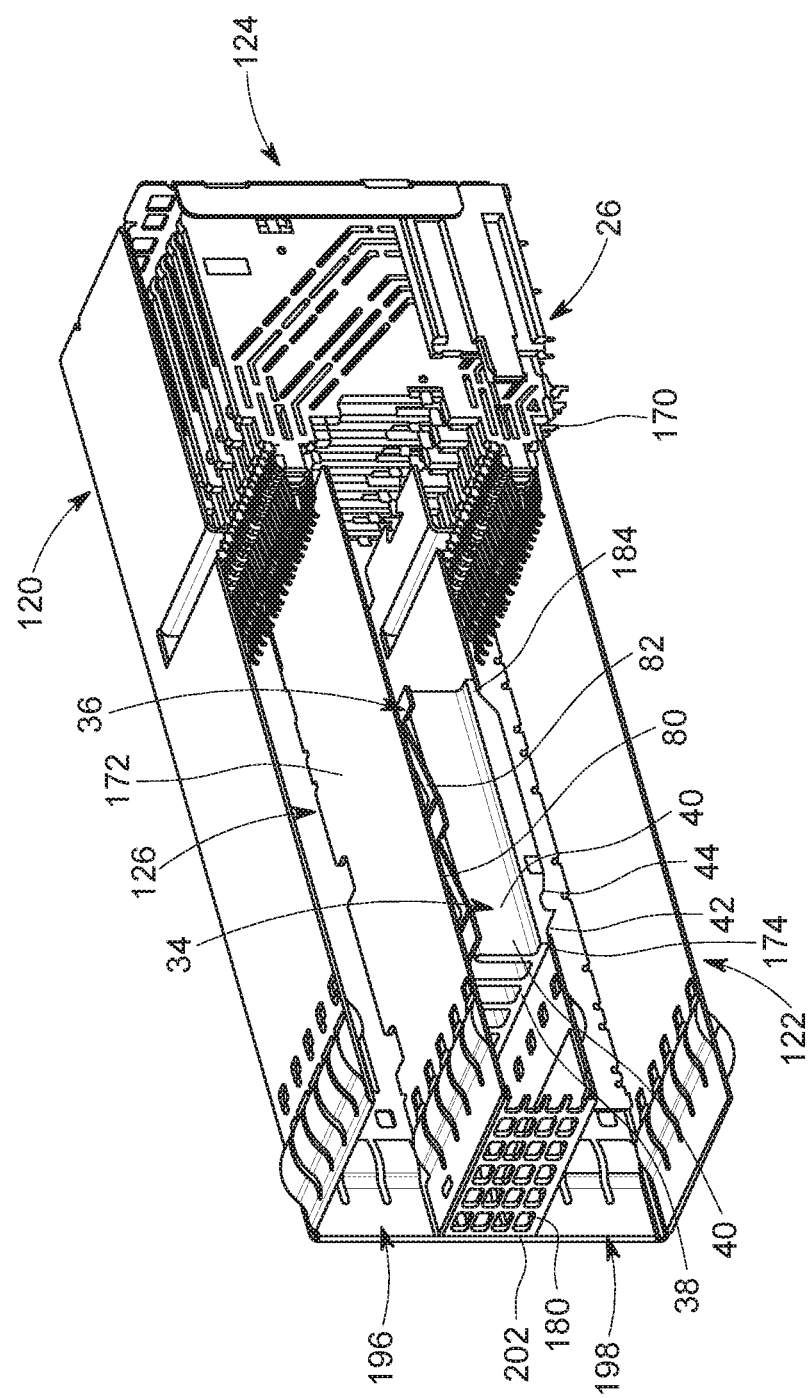
FIG. 3 is a cross-sectional view of the connector system.
Figure 4:
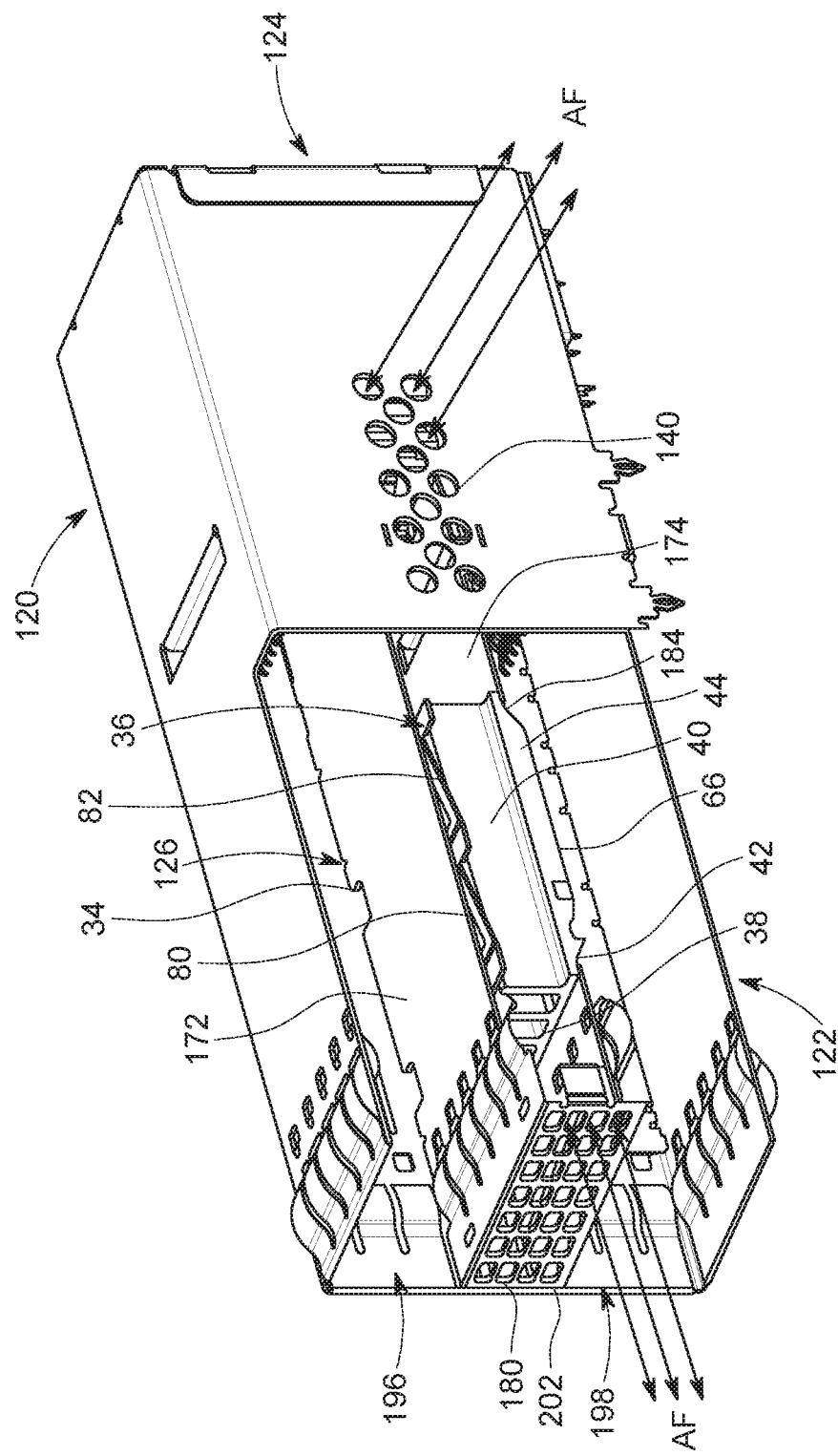
FIG. 4 is a partial cross-sectional view of the connector system.

While the disclosure may be susceptible to embodiment in different forms, there is shown in the drawings, and herein will be described in detail, specific embodiments with the understanding that the present disclosure is to be considered an exemplification of the principles of the disclosure and is not intended to limit the disclosure to that as illustrated and described herein. Therefore, unless otherwise noted, features disclosed herein may be combined to form additional combinations that were not otherwise shown for purposes of brevity. It will be further appreciated that in some embodiments, one or more elements illustrated by way of example in a drawing(s) may be eliminated and/or substituted with alternative elements within the scope of the disclosure.

A connector system 20 provides a cage assembly 22 in which a heat sink assembly 24 and a stacked connector 26 are mounted and provides for connection of a lower mating plug module 28 to the stacked connector 26 and for engagement with the heat sink assembly 24, and further provides for connection of an upper mating plug module (not shown) the stacked connector 26. The stacked connector 26 has a plurality of laterally spaced wafers and is positioned on a circuit board (not shown). Light pipes 32 are disposed in the cage assembly 22 and provide an indication to the status of the connection between the lower module 28 and the stacked connector 26 and the connection between the upper module and the stacked connector 26.

Figure 5:
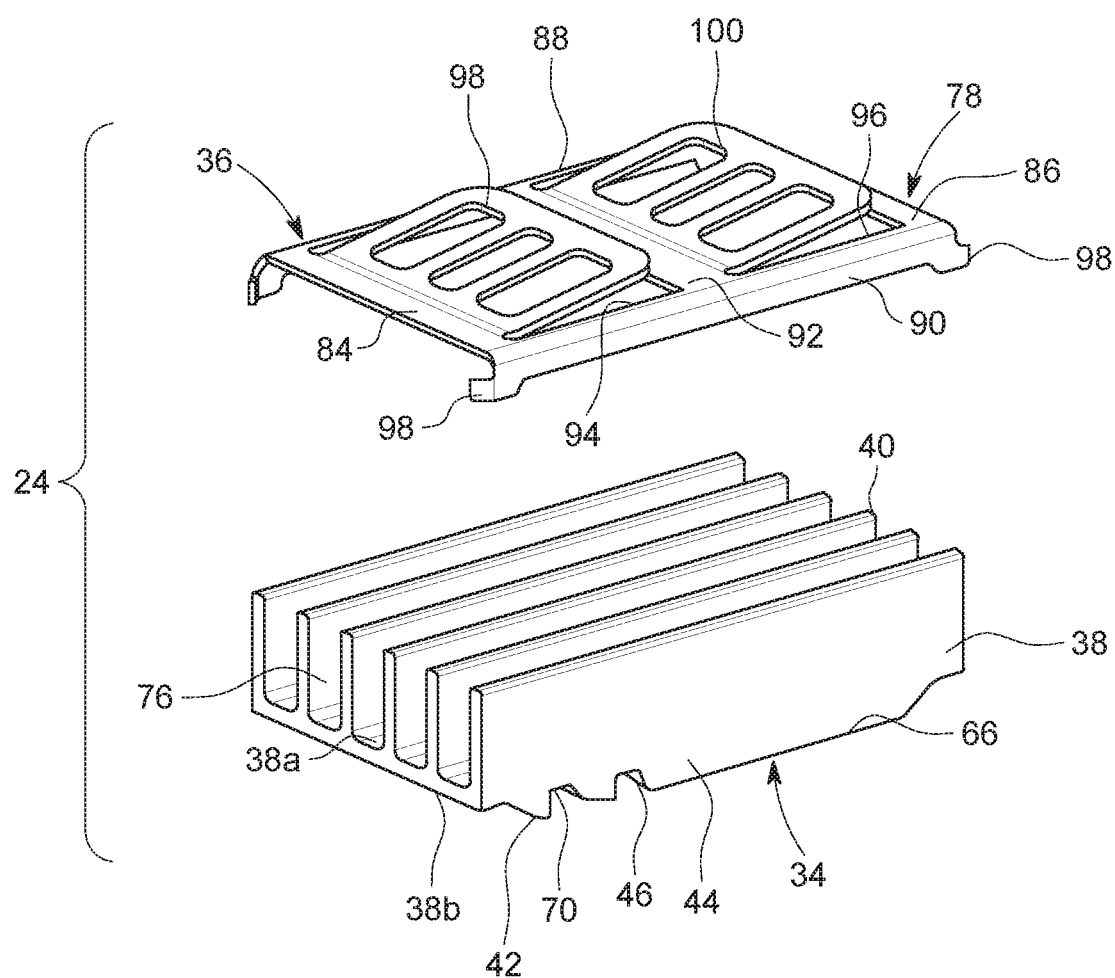
FIG. 5 is an exploded perspective view of an embodiment of a heat sink assembly of the connector system.
Figure 8:
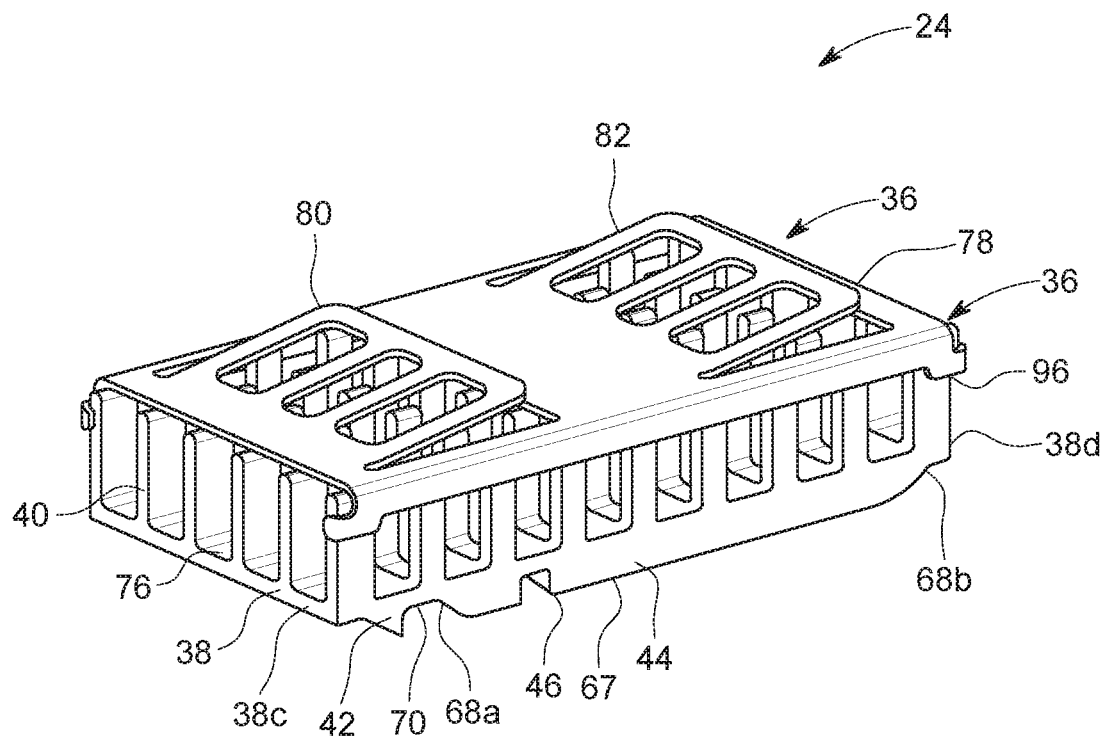
FIG. 8 is a perspective view of another embodiment of a heat sink assembly of the connector system.

As shown in FIGS. 5, 8 and 8, the heat sink assembly 24 is formed from a thermally conductive material and includes a heat sink 34 and a mounting bracket 36 disposed on the heat sink 34.

As shown in FIGS. 5-9, in an embodiment, the heat sink 34 includes a base 38, a plurality of fins 40 extending upwardly from an upper surface 38a of the base 38, a ramp 42 and a pedestal 44 extending downwardly from a flat or planar lower surface 38b of the base 38. The fins 40 are arranged to conduct heat away from the base 38 and dissipate heat by convection.

A front end 42a of the ramp 42 is proximate to, but spaced from, a front end 38c of the base 38. The ramp 42 has a front surface 52 which is angled relative to the lower surface 38b of the base 38. The front surface 52 extends from the lower surface 38b of the base 38 to a tip 54 which is offset from the lower surface 38b at a distance D1, see FIGS. 17 and 18. At least a portion of the front surface 52 is angled relative to the lower surface 38b of the base 38 and extends from the tip 54. Multiple angled surfaces may be provided as the front surface 52. The front surface 52 may include a planar vertical portion extending between the lower surface 38b of the base 38 and the angled portion. The ramp 42 further has a planar surface 58 at the rear edge of the ramp 42, which may be vertical or angled relative to the lower surface 38b of the base 38.

The pedestal 44 is positioned rearwardly of the ramp 42. The pedestal 44 has a front end 60, a flat or planar horizontal lower surface 62 extending from the front end 60, and a rear surface extending rearwardly from the lower surface 62. The rear surface of the pedestal 44 is proximate to, but spaced from, a rear end 38d of the base 38. In some embodiments, the rear surface of the pedestal 44 is curved. The lower surface 62 of the pedestal 44 is offset from the lower surface 38b at a distance D2.

A first notch or recess 46 is formed in the pedestal 44 and extends upwardly from the lower surface 38b; and a second notch or recess 48 is formed in the base 38 and extends upwardly from the lower surface 38b. The recesses 46, 48 are offset across a centerline of the heat sink 34 in a manner so as to make the heat sink 34 symmetrical.

A thermal interface material (TIM) 66, formed from a thermally conductive material, is provided on the lower surface 62 of the pedestal 44 to reduce thermal resistance between the heat sink 34 and the lower module 28. As a result, the thermal interface material 66 forms a flat or planar lower surface 67 and which has a leading edge 68a and a trailing edge 68b. In the embodiment shown, the thermal interface material 66 is formed from a compressible material, but other materials are contemplated which may vary in the degree of compressibility and the type of thermally conductive material in general. The thermal interface material 66 combats insufficient cooling which would otherwise result from a dry joint between the heat sink base 38 and the lower module 28 due to the high thermal resistance. The lower surface 67 of the thermal interface material 66 is offset from the lower surface 38b at a distance D3 which is greater than distance D2.

Figure 16:
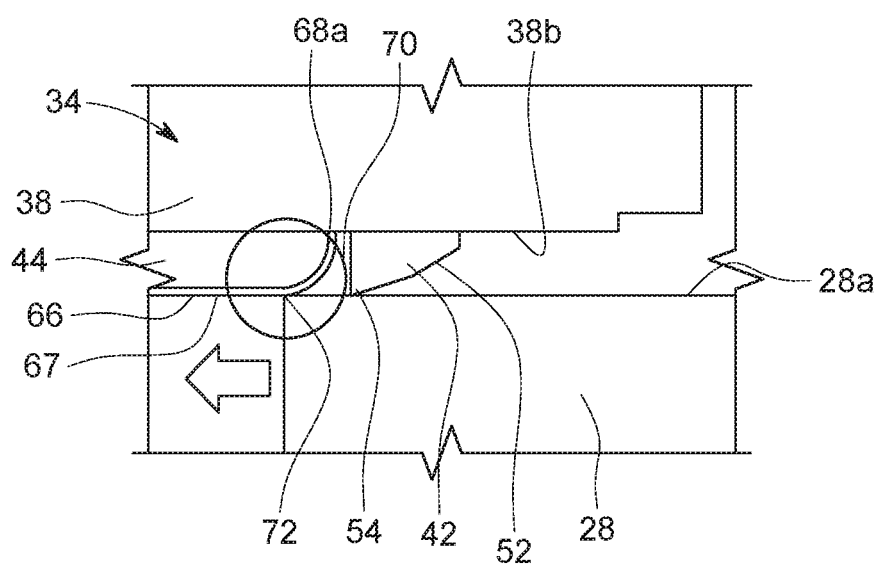
FIG. 16 is a partial side elevation view of a lower module being engaged with the heat sink.
Figure 17:
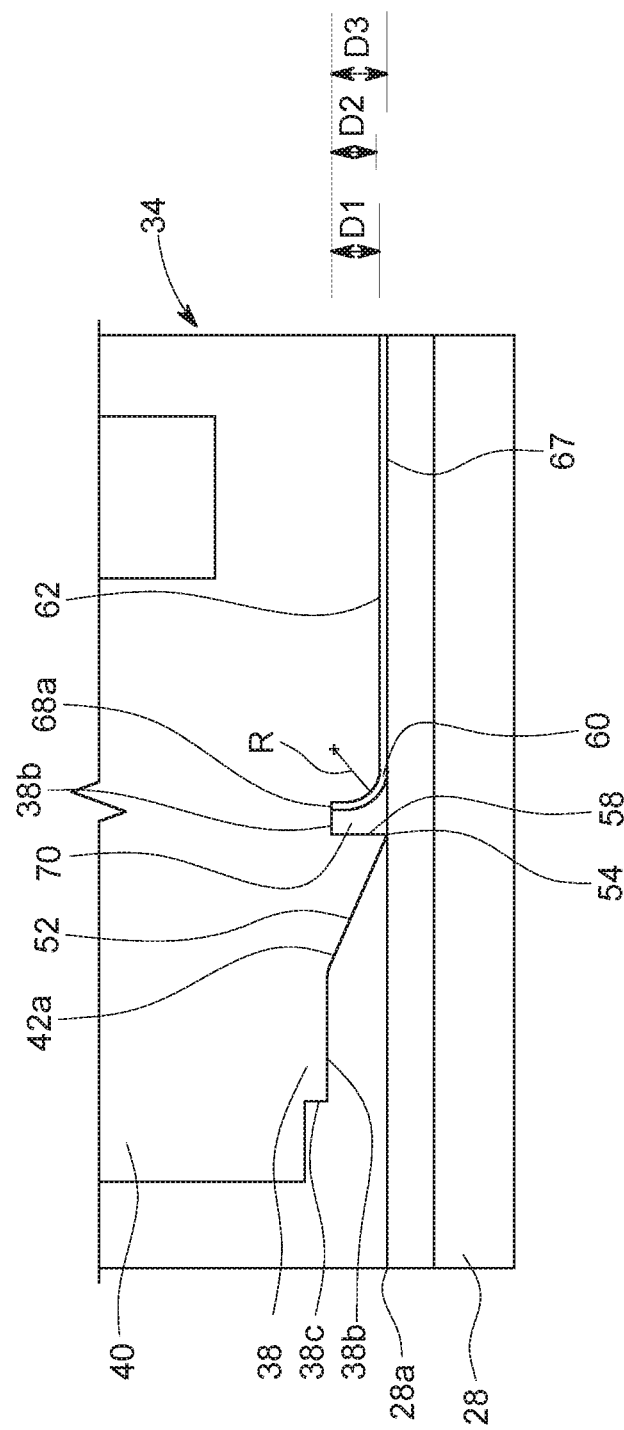
FIG. 17 is a partial side elevation view of a lower module being further engaged with the heat sink.

In a first embodiment as best shown in FIGS. 16 and 17, the distance D1 is less than the distance D2, for example, between 0.10 mm to 0.20 mm, and may be 0.15 mm, such that the tip 54 of the ramp 42 is in a spaced apart relationship to the lower surface 62 of the pedestal 44. In this embodiment, the ramp 42 and the pedestal 44 are separated from each other by a portion of the lower surface 38b of the base 38 such that a space 70 is formed. The rear surface 58 of the ramp 42 extends from the tip 54 to the lower surface 38h of the base 38. In this embodiment, the front end 60 of the pedestal 44 is a curved surface which extends downwardly from the lower surface 38b of the base 38 to the lower surface 62 of the pedestal 44 such that the leading edge 68a is within the space 70 and may be proximate to the lower surface 38b of the base 38. In an embodiment, this front curved surface is curved by a radius R, for example between 1.0 mm to 1.5 mm, and may be 1.25 mm. The thermal interface material 66 is provided on the front end 60 and the lower surface 62 of the pedestal 44, and may be provided on the rear surface 64 of the pedestal 44.

In use, the lower module 28 is inserted into the cage assembly 22 and a leading insertion edge 72 of the lower module 28 first contacts the angled front surface 52 of the ramp 42, slides along the of the ramp 42 and passes over the tip 54. The leading insertion edge 72 of the lower module 28 then engages with the thermal interface material 66 covering the greatest lead in area of the radiused front end 60 so that the lower module 28 and slides along the radiused front end 60, thereby providing minimal engagement between the lower module 28 and the thermal interface material 66. As such, essentially only sliding contact exists between the lower module 28 and the radiused front end 60 of the pedestal 44. The leading edge 68a of the thermal interface material 66 is protected from engagement with the leading insertion edge 72 of the lower module 28 since the leading edge 68a of the thermal interface material 66 is positioned within the space 70 and completely out of the path of the lower module 28 during insertion into the cage assembly 22. The lower module 28 is continued to be inserted into the cage assembly 22 until the heat sink 34 and the lower module 28 fully engage.

Figure 18:
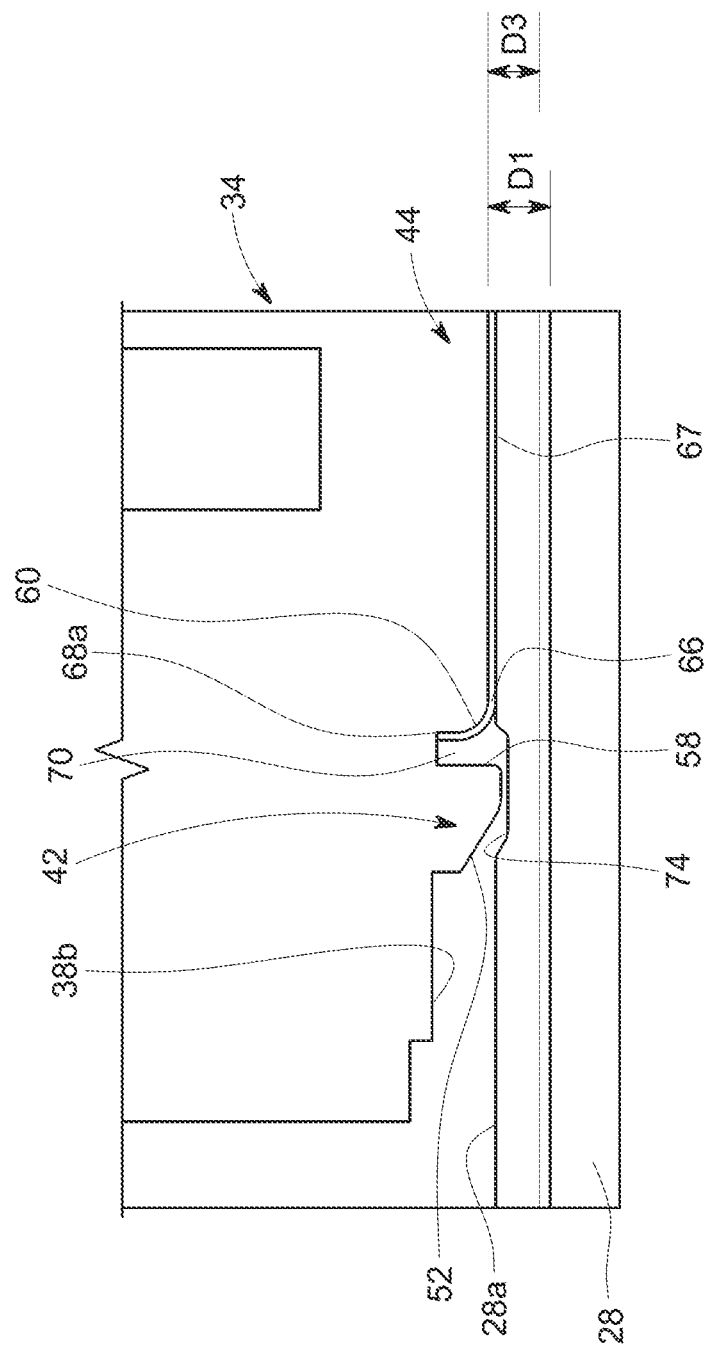
FIG. 18 is a partial side elevation view of a modified lower module engaged with the heat sink.

In an embodiment as best shown in FIG. 18, the distance D1 is greater than the distance D3, such that the tip 54 of the ramp 42 is in a spaced apart relationship to the lower surface 67 of the thermal interface material 66. In a first alternative, the ramp 42 and the pedestal 44 are separated from each other by a portion of the lower surface 38b of the base 38 such that the space 70 is formed. The rear surface 58 of the ramp 42 extends from the tip 54 to the lower surface 38b of the base 38. In this first embodiment, the front end 60 of the pedestal 44 extends downwardly from the lower surface 38b of the base 38 to the lower surface 62 of the pedestal 44, and may be a curved surface. The thermal interface material 66 is provided on the front end 60 of the pedestal 44 such that the leading edge 68*a* is within the space 70 and may be proximate to the lower surface 38*b* of the base 38, is further provided on the lower surface 62 of the pedestal 44, and may be provided on the rear surface 64 of the pedestal 44. In a second alternative, the ramp 42 and the pedestal 44 are not separated from each other by a portion of the lower surface 38*b* of the base 38 such that the space 70 is eliminated. The rear surface 58 of the ramp 42 extends from the tip 54 to the lower surface 62 of the pedestal 44. The thermal interface material 66 is provided on the front end 60 and the lower surface 62 of the pedestal 44 such that the leading edge 68*a* of the thermal interface material 66 abuts into or is proximate to the rear surface 58 of the ramp 42, is further provided on the lower surface 62 of the pedestal 44, and may be provided on the rear surface 64 of the pedestal 44.

In use, the lower module 28 is inserted into the cage assembly 22 and the leading insertion edge 72 of the lower module 28 first contacts the angled front surface 52 of the ramp 42, slides along the of the ramp 42 and passes over the tip 54. The leading insertion edge 72 of the lower module 28 then slides past the leading edge 68*a* of the thermal interface material 66 on the pedestal 44 without contacting the leading edge 68*a* and then further slides past the thermal interface material 66 until the lower module 28 is fully inserted into the cage assembly 22. To provide for contact between the lower module 28 and thermal interface material 66 once the lower module 28 is fully inserted into the cage assembly 22, the lower module 28 includes a recess 74 in an upper surface 28*a* of the lower module 28. The ramp 42 drops into the recess 74 when the recess 74 in the lower module 28 aligns with the ramp 42, which causes the thermal interface material 66 on the pedestal 44 to move into contact with the non-recessed portion of the upper surface 28*a* of the lower module 28. This engagement results in improved thermal transfer between the lower module 28 and the heat sink 34. The recess 74 may include a slanted or radius surface to allow the lower module 28 to be withdrawn and to prevent snapping of the lower module 28 to the ramp 42 upon removal. The leading edge 68*a* of the thermal interface material 66 is protected from engagement with the leading insertion edge 72 of the lower module 28 since the leading edge 68*a* of the thermal interface material 66 is upward of the tip 54 of the ramp 42 and completely out of the path of the lower module 28 during insertion into the cage assembly 22.

In use, the thermal interface material 66 is disposed between the lower module 28 and the heat sink 34 to assist in the heat transfer from the lower module 28, through the heat sink 34, and out of the cage assembly 22.

The thermal interface material 66 is typically secured to the heat sink 34 by a thermally conductive adhesive.

Figure 6:
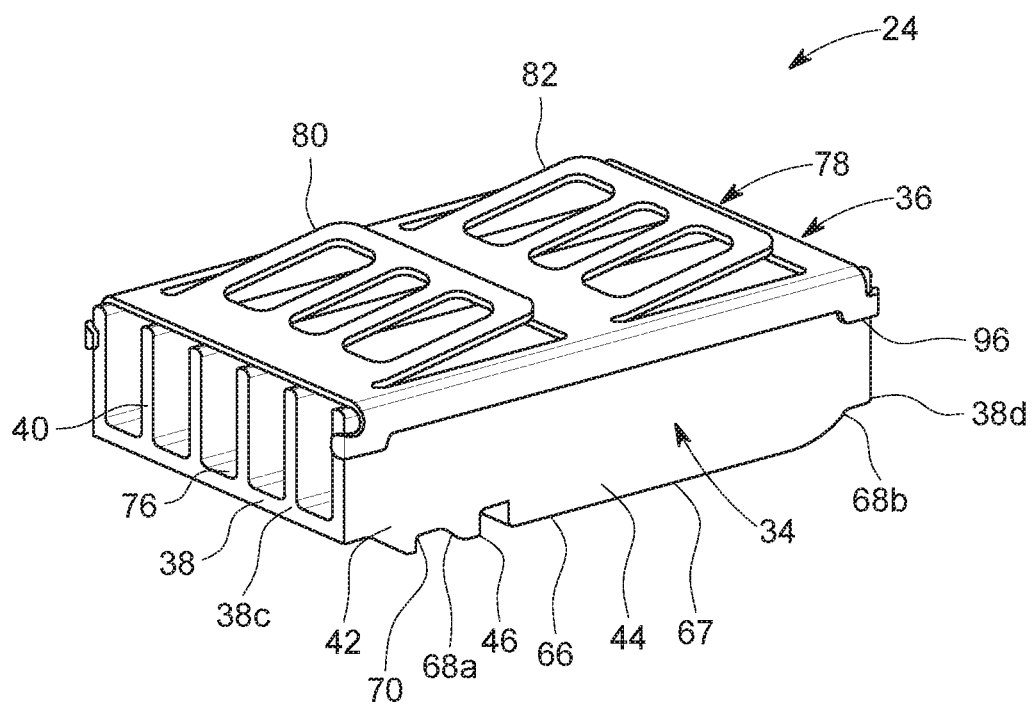
FIG. 6 is a perspective view of the heat sink assembly of FIG. 5.
Figure 7:
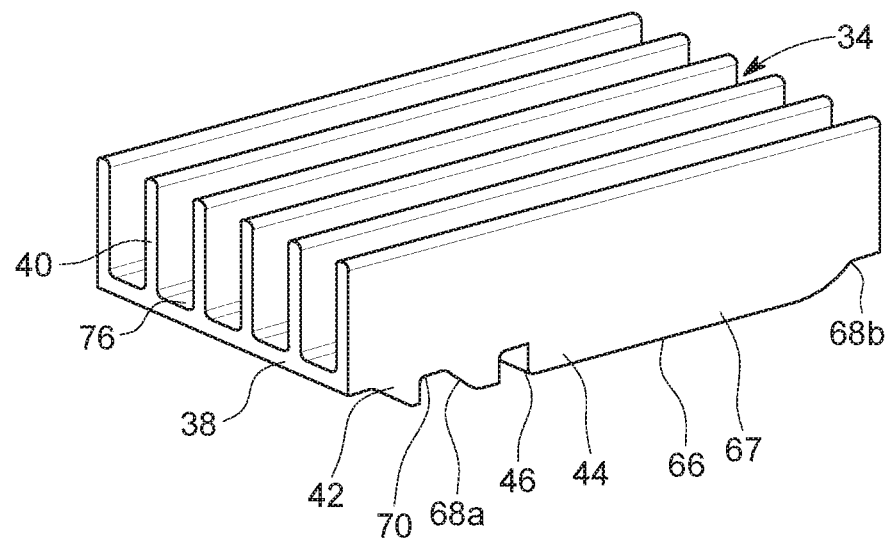
FIG. 7 is a perspective view of a heat sink of the heat sink assembly of FIG. 5.

In an embodiment as shown in FIGS. 5-7, the fins 40 are elongated and extend from the front end 38*c* of the base 38 to the rear end 28*d* of the base 38 such that elongated channels 76 are formed and extend from the front end 38*c* to the rear end 38*d*. In this configuration, air flow AF is restricted to a single direction pathway via the channels 76.

Figure 9:
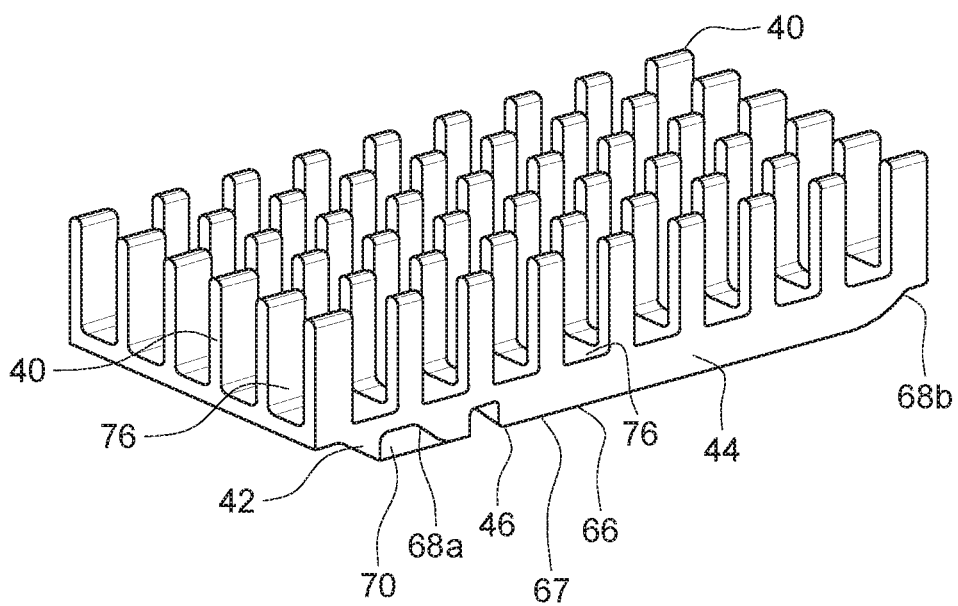
FIG. 9 is a perspective view of a heat sink of the heat sink assembly of FIG. 8.
Figure 10:
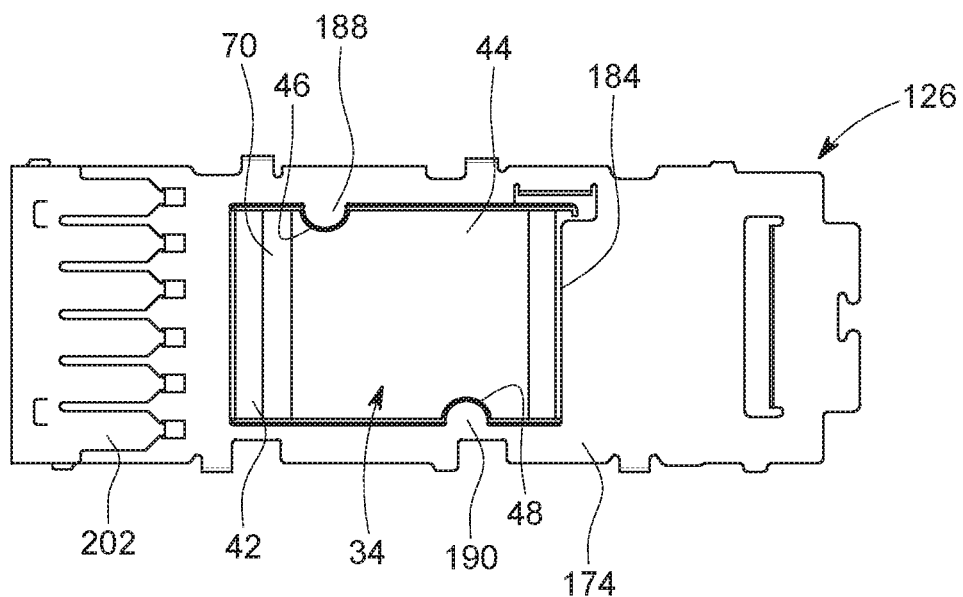
FIG. 10 is a bottom plan view of a heat sink assembly housing which has the heat sink assembly of FIG. 5 mounted therein, and with a gasket attached to the heat sink.
Figure 11:
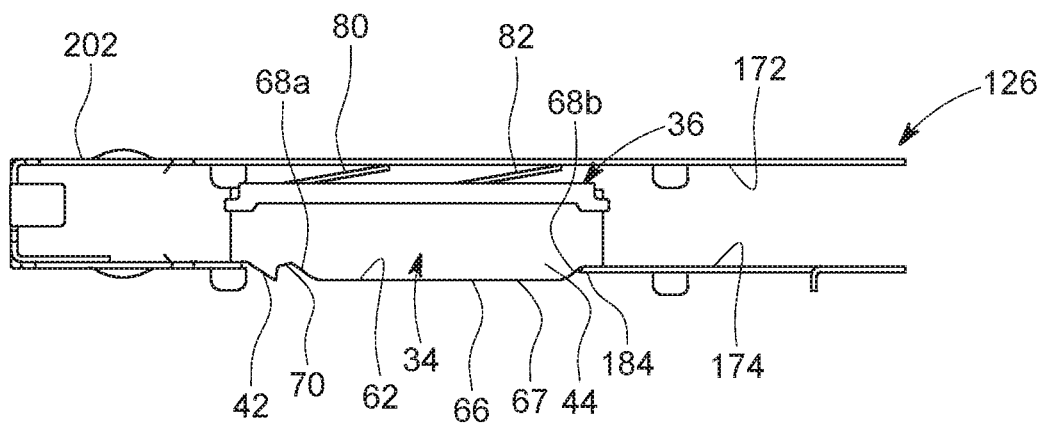
FIG. 11 is a cross-sectional view of the heat sink assembly housing, the heat sink assembly of FIG. and the gasket.

In an alternative embodiment as shown in FIGS. 8 and 9, the heat sink 34 includes an array of fins 40 with intersecting channels 76 creating a pillar-type arrangement. In this configuration, air flow AF is not restricted to a single direction pathway, but can be multi-directional and flow around the fins 40 and find the flow path of least resistance minimizing the possibility of stagnation. This arrangement provides maximum surface area of the fins 40 that can be exposed to the air.

In yet another embodiment, the fins 40 are eliminated and the heat sink 34 includes the base 38, and the ramp 42 and the pedestal 44 extending downwardly from the flat or planar lower surface 38*b* of the base 38. The heat sink 34 includes structure for providing liquid cooling.

In an embodiment as shown in FIG. 5, the mounting bracket 36 includes a frame 78 and biasing elements 80, 82 extending therefrom. As shown in the illustrated embodiment, the frame 78 is formed from a front wall 84, a rear wall 86, a side walls 88, 90 extending between the front and rear walls 84, 86, and a central wall 92 extending between the side walls 88, 90. The walls 84, 86, 88, 90, 92 extend in the same horizontal plane. A front aperture 94 is defined by the front and the central walls 84, 92 and the portions of the side walls 88, 90 between the front and central walls 84, 92. A rear aperture 96 is defined by the rear and central walls 86, 92 and the portions of the side walls 88, 90 between the rear and central walls 86, 92. Retaining clips 98 extend from the front and rear walls 84, 86. Front biasing elements 80 extend at an angle relative to the plane of the frame 78 and extend from the front wall 84 and overlap the front aperture 94. Rear biasing elements 82 extend at an angle relative to the plane of the frame 78 and extend from the central wall 90 and overlap the rear aperture 96. The biasing elements 80, 82 can be flexed relative to the frame 78 to align with the plane of the frame 78. The biasing elements 80, 82 may also include apertures such as aperture 100. Other forms of mounting brackets having a biasing element(s) can be provided.

The mounting bracket 36 is mounted on the heat sink 34 by the retaining clips 98 such that the frame 78 abuts the upper surfaces of the fins 40 and the biasing elements 80, 82 extend upwardly from the fins 40. In an unflexed condition, the biasing elements 80, 82 are angled relative to the fins 40. The biasing elements 80, 82 can be flexed to engage the fins 40. The retaining clips 98 engage with the fins 40 of the heat sink 34 to secure the mounting bracket 36 to the heat sink 34. If the fins 40 are eliminated from the heat sink 34, the frame 78 abuts the upper surface 38*a* of the base 38 and the biasing elements 80, 82 extend upwardly from the base 38.

In the drawings, a particular cage assembly 22 is shown, with the understanding that other forms may be used with the heat sink 34.

As shown, the cage assembly 22 includes a body 120, a lower cover 122, a rear panel 124 and an intermediate section or heat sink assembly housing 126 that are constructed to form an enclosure. The body 120, the lower cover 122, the rear panel 124 and the heat sink assembly housing 126 are thermally conductive. The body 120, lower cover 122 and rear panel 124 form a shield assembly for the components mounted therein. The heat sink assembly housing 126 provides a mount for the heat sink assembly 24 within the cage assembly 22.

Figure 12:
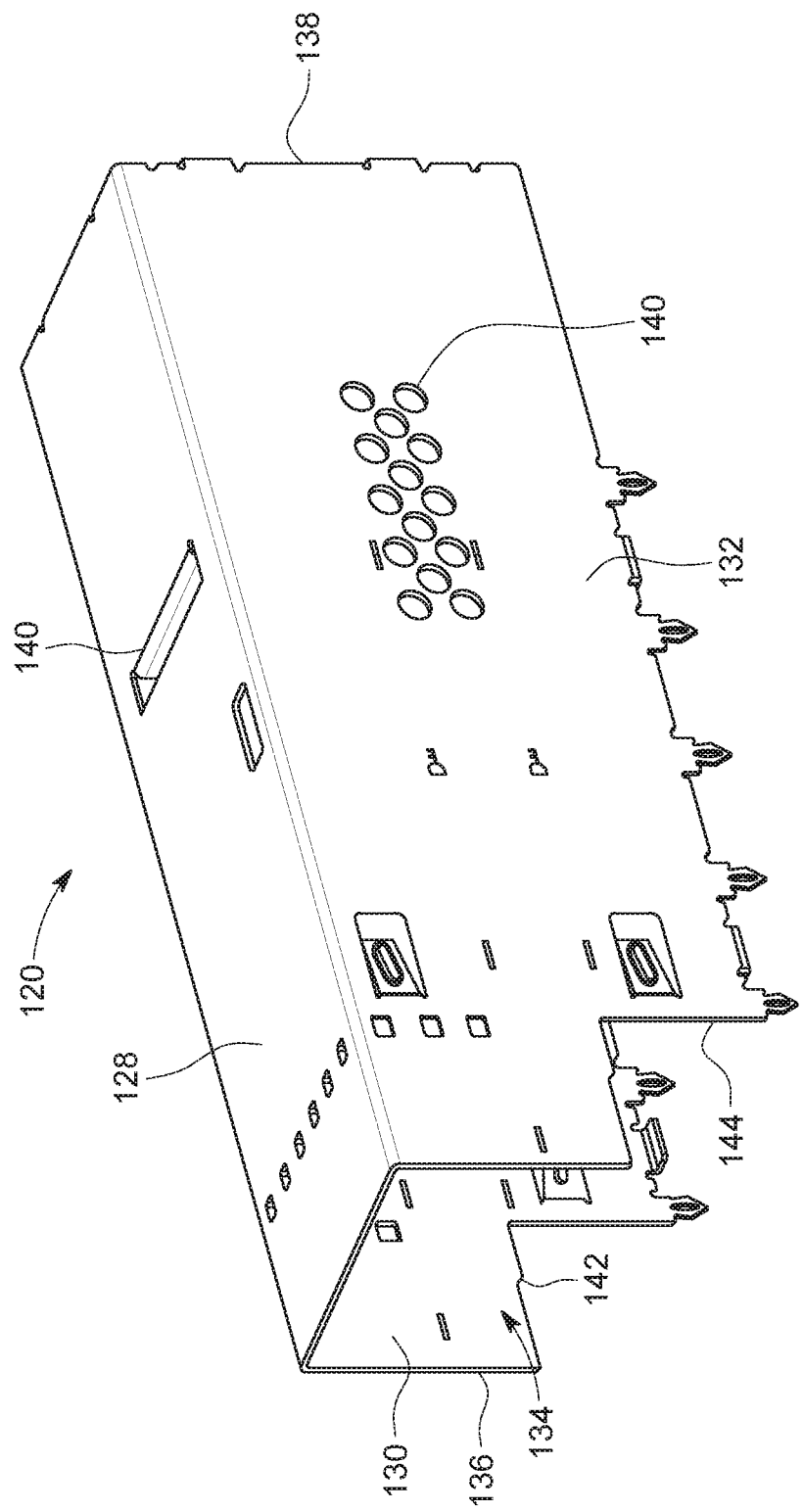
FIG. 12 is an enlarged perspective view of a body of the connector system.

As shown in FIG. 12, the body 120 includes an upper wall 128 and side walls 130, 132 extending downwardly therefrom at opposite side edges thereof, such that a generally U-shape passageway 134 is formed from an open front end 136 to an open rear end 138. The walls 128, 130, 132 may have openings 140 therethrough to allow air flow AF therethrough. In an embodiment, each side wall 130, 132 has a cutout 142, 144 which extends from the front end 136 rearwardly a predetermined length and extends from a lower end 146 of the respective side wall 130, 132 upwardly a predetermined height.

Figure 13:
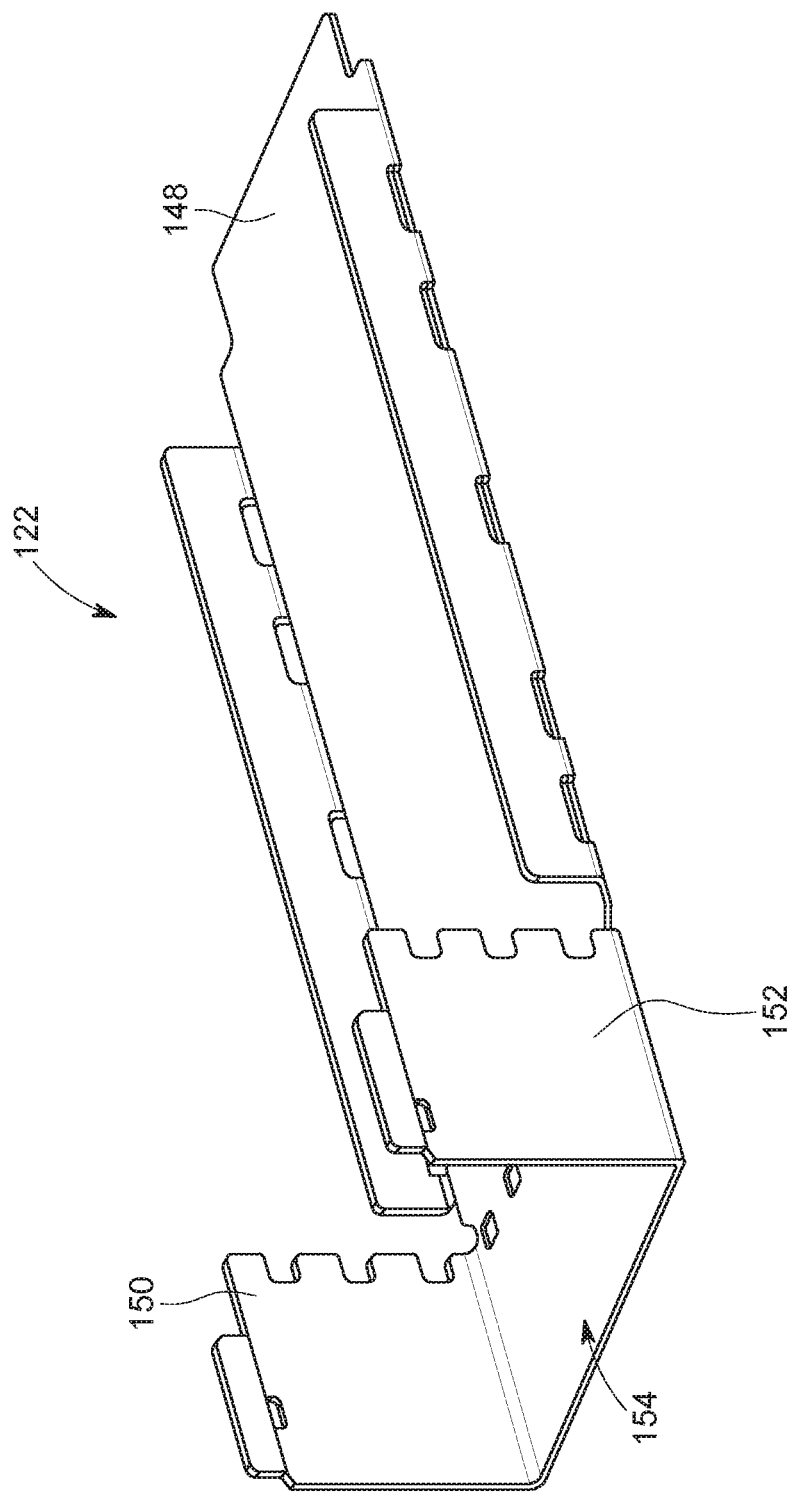
FIG. 13 is an enlarged perspective view of a lower cover of the connector system.

As shown in FIG. 13, the lower cover 122 includes a lower wall 148 and side walls 150, 152 extending upwardly therefrom at opposite edges thereof, such that a generally U-shape passageway 154 is formed from an open front end 156 to an open rear end 158.

Figure 14:
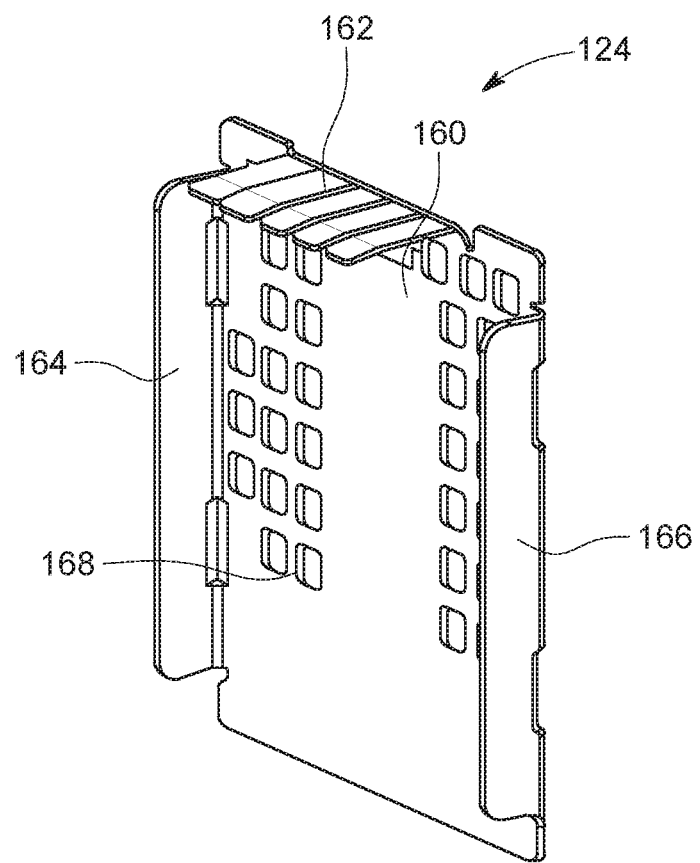
FIG. 14 is an enlarged perspective view of a rear panel of the connector system.

As shown in FIG. 14, the rear panel 124 has a rear wall 160, an upper tab 162 extending forwardly from an upper edge of the rear wall 160, and side tabs 164, 166 extending forwardly from opposite side edges of the rear wall 160. The rear wall may have a plurality of openings 168 therethrough to allow air flow AF therethrough.

To assemble the body 120, the lower cover 122 and the rear panel 124 into the enclosure, the side wall 150 of the lower cover 122 seats within the cutout 142 in the body 120 and the side wall 152 of the lower cover 122 seats within the cutout 144 in the body 120 and the body 120 and the cover 122 are suitably secured to each other. For example, locking fingers on the body 120 can be inserted into slots on the lower cover 122 to secure the body 120 and the cover 122 together. The tabs 162, 164, 166 on the rear panel 124 engage with respective walls 128, 130, 132 of the body 120 and are suitably secured thereto. The lower wall 148 of the lower cover 122 does not extend the full length of the upper wall 128 of the body 120 such that a lower opening 170 is provided in the rear of the cage assembly 22.

Figure 15:
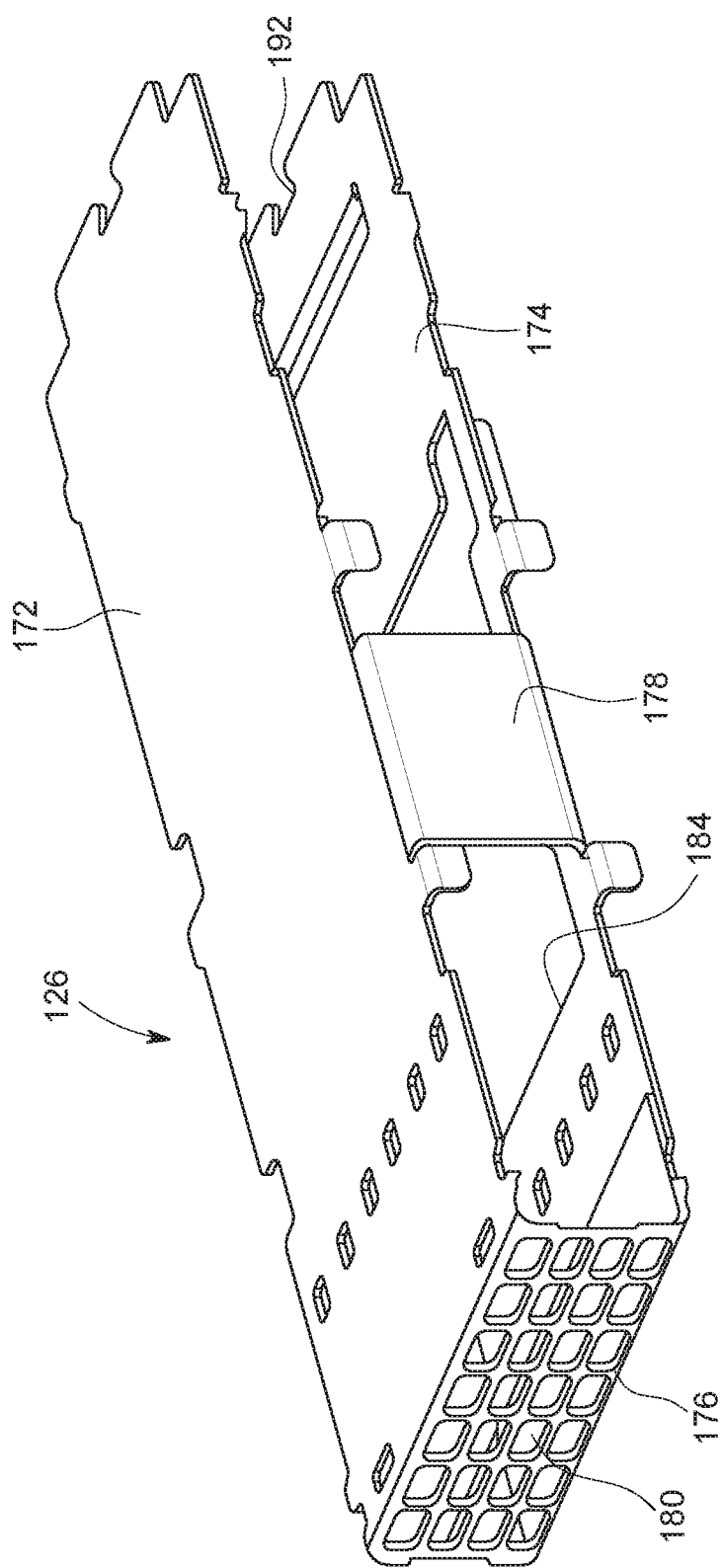
FIG. 15 is an enlarged perspective view of the heat sink assembly housing.

As shown in FIG. 15, the heat sink assembly housing 126 includes upper and lower walls 172, 174 which are spaced apart from each other, but are connected to each other. As shown, the upper and lower walls 172, 174 are connected by a front wall 176 which extends between front ends of the upper and lower walls 172, 174, and support walls 178 (only one of which is shown) extend between the upper and lower walls 172, 174 at positions which are spaced from the front wall 176. The front wall 176 has a plurality of openings 180 therethrough to allow air flow AF therethrough. The upper and lower walls 172, 174 may have a plurality of openings therethrough to allow air flow AF therethrough. A heat sink hole 184 is provided through the lower wall 174 and is spaced from the front and rear edges thereof. A first tab 186 is formed by the lower wall 174 and extends into the heat sink hole 184. A second tab 188 is formed by the lower wall 174 on the opposing side of the heat sink hole 184 and extends into the heat sink hole 184. The tabs 186, 188 are offset from each other across a centerline of the heat sink hole 184.

The heat sink assembly housing 126 is mounted within the body 120 such that side edges of the upper and lower walls 172, 174 are proximate to the inner surfaces of the respective side walls 130, 132 of the body 120. The front wall (if provided) generally aligns with front edges of the upper wall 128 and the side walls 130, 132 of the body 120 and with the front edge of the lower wall 148 of the lower cover 122. The rear end of the upper and lower walls 172, 174 align with, or generally align with, the front edge of the lower opening 170. The upper and lower walls 172, 174 are suitably secured to the side walls 130, 132, for example by locking tabs seating with apertures. The heat sink assembly housing 126 and portions of the side walls 130, 132 of the body 120 form a heat sink assembly retaining space 192 in which the heat sink assembly 24 is mounted.

The lower surface 38b of the base 38 of the heat sink 34 is proximate to the upper surface of the lower wall 174, and the ramp 42 and the pedestal 44 extend through the heat sink hole 184 in the lower wall 174. The biasing elements 80, 82 of the mounting bracket 36 engage the lower surface of the upper wall 174 and force the lower surface 38b of the base 38 of the heat sink 34 against the upper surface of the lower wall 174. The tabs 188, 190 on the heat sink assembly housing 126 seat within the recesses 46, 48 in the heat sink 34.

A lower port 194 is defined between the lower wall 174 of the heat sink assembly housing 126, a lower portion of the side walls 130, 132 of the body 120 and the and the lower cover 122. The lower module 28 seats within the lower port 194 as described herein. An upper port 196 is defined between the upper wall 172 of the heat sink assembly housing 126, an upper portion of the side walls 130, 132 of the body 120 and the upper wall 128 of the body 120. The upper module seats within the upper port 196.

Gaskets 198, 200, 202 are secured around the front edges of the body 120, the lower cover 122 and the front wall 176 (if provided) of the heat sink assembly housing 126. The gaskets 198, 200, 202 provide an electromagnetic interference (EMI) seal when the connector system 20 is mounted in a rack (not shown) with the gaskets 198, 200, 202 engaging a bezel (not shown) of the rack. The gaskets 198, 200, 202 include resilient spring fingers that extend into the ports 194, 196 and spring fingers that extend away from the ports 194, 196. The spring fingers extending into the ports 194, 196 are configured to engage the modules 28, 30 inserted into the ports 194, 196 and the outwardly extending spring fingers engage the bezel. The gasket 202 has openings 204 which align with the openings 180 in the front wall 176 of the heat sink assembly housing 126.

To assemble the stacked connector 26 with the cage assembly 22, the stacked connector 26 is inserted through the lower opening 170 and into the interior of the cage assembly 22.

The heat sink 34 is known as a riding heat sink in the fact that the lower module 28 is inserted into the lower port 194 and mated with the stacked connector 26.

With regard to the first embodiment shown in FIGS. 16 and 17, the lower module 28 is inserted into the lower port 194 and the leading insertion edge 72 of the lower module 28 first contacts the angled front surface 52 of the ramp 42, slides along the angled front surface 52 and passes over the tip 54. This causes the front portion of the heat sink 34 to be displaced upwardly, whereas the rear portion of the heat sink 34 still engages the lower wall 174 of the heat sink assembly housing 126. The tabs 188, 190 on the heat sink assembly housing 126 and the recesses 46, 48 in the heat sink 34 provide an aligning feature that prevent the heat sink 34 from canting and, therefore prevent the heat sink 34 from becoming wedged within the heat sink assembly housing 126. Additionally, the tabs 188, 190 and the recesses 46, 48 keep the heat sink 34 in position and do not allow the heat sink 34 to be moved forward or backward within the heat sink assembly housing 126. When the front portion of the heat sink 34 is displaced upwardly, the front biasing elements 80 are deflected between the heat sink 34 and the upper wall 172, and provide a downward reaction force on the heat sink 34. This maintains constant contact between the upper surface of the lower module 28 and the heat sink 34, thereby creating a thermal conducting connection. As the lower module 28 is further inserted into the lower port 194, the leading insertion edge 72 of the lower module 28 then engages with the thermal interface material 66 covering the greatest lead in area of the radiused front end 60 of the pedestal 44 so that the lower module 28 and slides along the radiused front end 60. This causes the front portion of the heat sink 34 to be further displaced upwardly. When the heat sink 34 is displaced upwardly, the front biasing elements 80 are deflected between the heat sink 34 and the upper wall 172, and provide a downward reaction force on the heat sink 34. After the lower module 28 slides over the radiused front end 60, the upper surface of the lower module 28 slides along the lower surface of the thermal interface material 66 that covers the lower surface 62 of the pedestal 44, thereby causing the rear portion of the heat sink 34 to be displaced upwardly. When the rear portion of the heat sink 34 is displaced upwardly, the rear biasing elements 82 are deflected between the heat sink 34 and the upper wall 172, and provide a downward reaction force on the heat sink 34. The lower module 28 is continued to be slid relative to the heat sink 34 until the lower module 28 is fully inserted into the cage assembly 22 and engages with the connector 26.

With regard to the second embodiment shown in FIG. 18, the lower module 28 is inserted into the lower port 194 and the leading insertion edge 72 of the lower module 28 first contacts the angled front surface 52 of the ramp 42, slides along the angled front surface 52 and passes over the tip 54. This causes the heat sink 34 to be upwardly displaced. The tabs 188, 190 on the heat sink assembly housing 126 and the recesses 46, 48 in the heat sink 34 provide an aligning feature that prevent the heat sink 34 from canting and, therefore prevent the heat sink 34 from becoming wedged within the heat sink assembly housing 126. Additionally, the tabs 188, 190 and the recesses 46, 48 keep the heat sink 34 in position and do not allow the heat sink 34 to be moved forward or backward within the heat sink assembly housing 126. When the heat sink 34 is upwardly displaced, the biasing elements 80, 82 are deflected between the heat sink 34 and the upper wall 172, and provide a downward reaction force on the heat sink 34. This maintains constant contact between the upper surface of the lower module 28 and tip 54 of the ramp 42, thereby creating a thermal conducting connection. As the lower module 28 is further inserted into the lower port 194, the lower module 28 then slides past the thermal interface material 66 on the pedestal 44 until the lower module 28 is fully inserted into the cage assembly 22 and engages with the connector 26. To provide for contact between the lower module 28 and thermal interface material 66 once the lower module 28 is fully inserted into the cage assembly 22, the ramp 42 drops into the recess 74 when the recess 74 in the lower module 28 aligns with the ramp 42, which causes the biasing elements 80, 82 to displace the heat sink 34 downwardly so that the thermal interface material 66 on the pedestal 44 comes into contact with the upper surface of the lower module 28.

Figure 19:
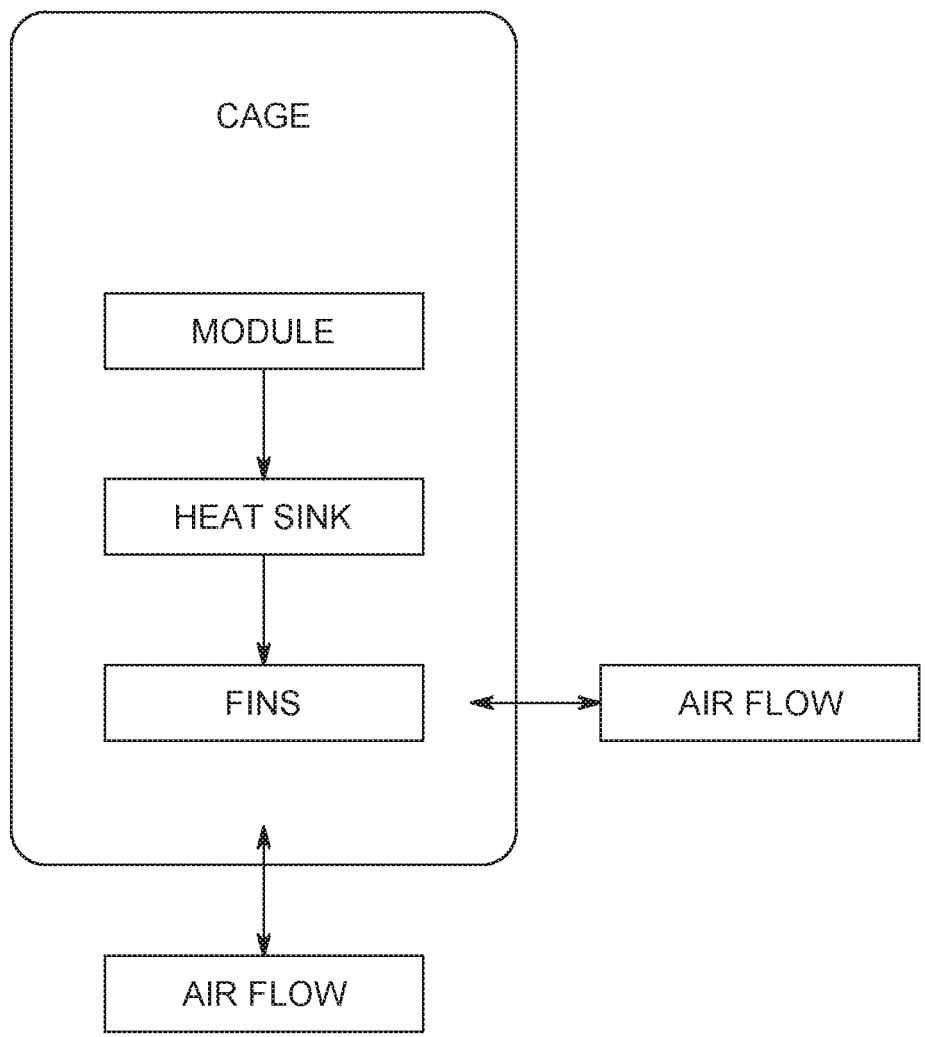
FIG. 19 depicts a schematic of the thermal flow of the connector system.

This thermal conducting connection allows the heat energy generated in the lower module 28 to pass to the heat sink 34 to be dissipated. Air flows AF through the cage assembly 22 and through the channels 76, dissipating the heat energy generated by the lower module 28 from the connector system 20. FIG. 19 depicts a schematic of the thermal flow.

Air flows through the various openings, such as openings 140, 168, 180, 204 which provide paths for thermal energy removal.

While various embodiments are contemplated, it should be noted that the depicted configuration of the thermal pathway between the lower module 28 and the environment is such that the air flow AF enters and exists the cage assembly 22 through the front and rear ends of the cage assembly 22 and the various openings in the walls, and flows through channels 76 dissipating the heat energy transferred to the fins 40 of the heat sink 34. The air flow AF thorough the cage assembly 22 can be forced by a fan defining an intake and an exhaust.

While particular embodiments are illustrated in and described with respect to the drawings, it is envisioned that those skilled in the art may devise various modifications without departing from the spirit and scope of the appended claims. It will therefore be appreciated that the scope of the disclosure and the appended claims is not limited to the specific embodiments illustrated in and discussed with respect to the drawings and that modifications and other embodiments are intended to be included within the scope of the disclosure and appended drawings. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the disclosure and the appended claims.

We claim:

1. A connector system comprising:
a cage assembly including an upper wall, a lower wall and side walls extending between the upper and lower walls, the walls forming a port having a front end and a rear end, the upper wall having a heat sink hole therethrough;
a thermally conductive heat sink disposed on the upper wall, the heat sink comprising a base, a ramp extending from a lower surface of the base, the ramp having a front surface extending from the lower surface to a tip, at least a portion of the front surface being angled, and a pedestal extending from the lower surface of the base, the pedestal having a lower planar surface, the ramp being forward of the pedestal, the lower surface of the base being proximate to the upper wall, and the ramp and pedestal extending through the heat sink hole and into the port; and
a thermal interface material disposed on the lower planar surface of the pedestal, the thermal interface material having a leading edge which is proximate to the ramp;
wherein a connector can be mounted to the cage assembly and a module can be mounted in the port for connection to the heat sink and to to the connector, wherein the ramp and the pedestal are separated by a portion of the lower wall such that a space is provided between the ramp and the pedestal.

2. The connector system of claim 1, wherein the thermal interface material is secured to the pedestal by a thermally conductive adhesive.

3. The connector system of claim 1, wherein the walls are thermally conductive.

4. The connector system of claim 1, wherein the leading edge of the thermal interface material is provided in the space.

5. The connector system of claim 4, wherein the front surface of the pedestal is radiused.

6. The connector system of claim 4, wherein the front surface of the pedestal has a radius of between 1.0 mm to 1.5 mm.

7. The connector system of claim 5, wherein the tip of the ramp is spaced from the lower surface at a first distance, and the lower surface of the pedestal is spaced from the lower surface at a second distance, the second distance being greater than the first distance.

8. The connector system of claim 7, wherein the second distance is greater than the first distance by between 0.10 mm to 0.201 mm.

9. The connector system of claim 6, wherein the cage assembly further includes a second upper wall connected to the first defined upper wall, the first defined upper wall, the second upper wall and the side walls forming a heat sink assembly retaining space, the heat sink being seated within the heat sink assembly retaining space; and further comprising a mounting bracket engaged with the heat sink and the cage assembly.

10. The connector system of claim 9, wherein the mounting bracket includes at least one biasing element, the at least one biasing element being engaged with the second upper wall.

11. The connector system of claim 5, wherein the tip of the ramp is spaced from the lower surface at a first distance, and a lower surface of the thermal interface material on the lower planar surface of the pedestal is spaced from the lower surface at a second distance, the second distance being less than the first distance.

12. The connector system of claim 11, wherein the cage assembly further includes a second upper wall connected to the first defined upper wall, the first defined upper wall, the second upper wall and the side walls forming a heat sink assembly retaining space, the heat sink being seated within the heat sink assembly retaining space; and further comprising a mounting bracket engaged with the heat sink and the cage assembly.

13. The connector system of claim 12, wherein the mounting bracket includes at least one biasing element, the at least one biasing element being engaged with the second upper wall.

14. The connector system of claim 1, wherein the tip of the ramp is spaced from the lower surface at a first distance, and a lower surface of the thermal interface material on the lower surface of the pedestal is spaced from the lower surface at a second distance, the second distance being less than the first distance.

15. The connector system of claim 14, wherein the cage assembly further includes a second upper wall connected to the first defined upper wall, the first defined upper wall, the second upper wall and the side walls forming a heat sink assembly retaining space, the heat sink being seated within the heat sink assembly retaining space; and further comprising a mounting bracket engaged with the heat sink and the cage assembly.

16. The connector system of claim 15, wherein the mounting bracket includes at least one biasing element, the at least one biasing element being engaged with the second upper wall.

17. The connector system of claim 1, wherein the cage assembly further includes a second upper wall connected to the first defined upper wall, the first defined upper wall, the second upper wall and the side walls forming a heat sink assembly retaining space, the heat sink being seated within the heat sink assembly retaining space; and further comprising a mounting bracket engaged with the heat sink and the cage assembly.

18. The connector system of claim 17, wherein the mounting bracket includes at least one biasing element, the at least one biasing element being engaged with the second upper wall.

19. The connector system of claim 1, wherein the cage assembly further includes a second upper wall connected to the side walls and spaced from the first defined upper wall, the first defined upper wall, the second upper wall and the side walls forming a second port, wherein a second module can be mounted in the second port for connection to the connector.

20. The connector system of claim 1, wherein the cage assembly further includes a second upper wall connected to the first defined upper wall, the first defined upper wall, the second upper wall and the side walls forming a heat sink assembly retaining space, the heat sink being seated within the heat sink assembly retaining space, and a third upper wall connected to the side walls and spaced from the second upper wall, the second and third upper walls and the side walls forming a second port, wherein a second module can be mounted in the second port for connection to the connector; and further comprising a mounting bracket engaged with the heat sink and the second upper wall.

* * * * *